United States Patent
Aanerud et al.

(10) Patent No.: US 10,600,756 B1
(45) Date of Patent: Mar. 24, 2020

(54) WIRE BONDING TECHNIQUE FOR INTEGRATED CIRCUIT BOARD CONNECTIONS

(71) Applicants: Evan A. Aanerud, King George, VA (US); Kahle B. Sullivan, Fredericksburg, VA (US); James J. Malove, Fredericksburg, VA (US); Justin M. Dougherty, King George, VA (US)

(72) Inventors: Evan A. Aanerud, King George, VA (US); Kahle B. Sullivan, Fredericksburg, VA (US); James J. Malove, Fredericksburg, VA (US); Justin M. Dougherty, King George, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 393 days.

(21) Appl. No.: 15/432,969

(22) Filed: Feb. 15, 2017

(51) Int. Cl.
    *H01L 23/00* (2006.01)
    *H01L 21/44* (2006.01)

(52) U.S. Cl.
    CPC .............. *H01L 24/85* (2013.01); *H01L 21/44* (2013.01); *H01L 24/45* (2013.01); *H01L 24/48* (2013.01); *H01L 24/78* (2013.01); *H01L 2224/45005* (2013.01); *H01L 2224/45144* (2013.01); *H01L 2224/48091* (2013.01); *H01L 2224/48105* (2013.01); *H01L 2224/48225* (2013.01); *H01L 2224/48464* (2013.01); *H01L 2224/48477* (2013.01); *H01L 2224/78824* (2013.01);

(Continued)

(58) Field of Classification Search
CPC ........... H01L 24/85; H01L 2224/05599; H01L 2224/48458; H01L 2224/48465; H01L 2224/85345; H01L 24/45; H01L 24/78; H01L 2224/45144; H01L 2224/45147; H01L 2224/48091; H01L 2224/78301; H01L 2224/85045; H01L 2224/85181; H01L 2224/85186; H01L 2224/85196; H01L 2924/00014; H01L 24/48
See application file for complete search history.

(56) References Cited

U.S. PATENT DOCUMENTS

| | | | |
|---|---|---|---|
| 5,192,018 A | 3/1993 | Terakado et al. | 228/179 |
| 5,961,029 A | 10/1999 | Nishiura et al. | 228/180.5 |

(Continued)

OTHER PUBLICATIONS

MIL-STD-883K Test Method Standard Microcircuits Jul. 20, 2016. http://everyspec.com/MIL-STD/MIL-STD-0800-0899/MIL-STD-883K_54326/.

*Primary Examiner* — Savitri Mulpuri
(74) *Attorney, Agent, or Firm* — Gerhard W. Thielman (57) ABSTRACT

A method is provided for connecting a chip die to a circuit board with a capillary dispenser to deposit gold. The method includes forming a first bond by depositing gold from the dispenser to a board pad on the circuit board; forming a second bond by depositing the gold from the dispenser to a die pad on the chip die; extruding a filament of the gold by the dispenser in a normal direction from the second bond; rotating the filament laterally away from the first bond along a first radius; extruding the filament while rotating the filament towards the first bond along a second radius larger than the first radius; and forming a third bond by depositing the gold on the first bond to form a third bond.

3 Claims, 8 Drawing Sheets

(52) U.S. Cl.
CPC .............. *H01L 2224/85181* (2013.01); *H01L 2224/85986* (2013.01)

(56) References Cited

U.S. PATENT DOCUMENTS

| | | | |
|---|---|---|---|
| 5,967,401 A | 10/1999 | Nishiura et al. | 228/180.5 |
| 6,119,926 A | 9/2000 | Egger et al. | 228/180.5 |
| 6,213,384 B1 | 4/2001 | Nishiura et al. | 228/180.5 |
| 6,548,887 B2 | 4/2003 | Collins | 257/676 |
| 6,642,610 B2 | 11/2003 | Park et al. | 257/678 |
| 7,227,095 B2 | 6/2007 | Roberto et al. | 219/69.11 |
| 7,285,854 B2 * | 10/2007 | Ishikawa | B23K 20/007 257/737 |
| 7,407,080 B2 | 8/2008 | Lee et al. | 228/4.5 |
| 7,453,156 B2 | 11/2008 | Lee et al. | 257/784 |
| 7,464,854 B2 | 12/2008 | Babinetz | 228/180.5 |
| 7,581,666 B2 | 9/2009 | Tong et al. | 228/193 |
| 7,780,064 B2 | 8/2010 | Wong et al. | 228/180.5 |
| 7,934,634 B2 | 5/2011 | Mii et al. | 228/180 |
| 7,935,979 B2 | 5/2011 | Shum et al. | 257/99 |
| 8,048,720 B2 * | 11/2011 | Calpito | H01L 21/6835 438/123 |
| 8,125,091 B2 | 2/2012 | Low | 257/780 |
| 8,198,737 B2 | 6/2012 | Zhang et al. | 257/780 |
| 8,575,762 B2 | 11/2013 | Nondhasitthichai et al. | 257/777 |
| 8,642,393 B1 * | 2/2014 | Yu | H01L 24/05 257/678 |
| 8,889,995 B2 | 11/2014 | Sun et al. | 174/261 |
| 9,275,970 B1 | 3/2016 | Chen et al. | |
| 9,368,471 B2 * | 6/2016 | Akiyama | H01L 24/78 |
| 9,431,275 B2 | 8/2016 | Bindrup et al. | |
| 9,457,421 B2 * | 10/2016 | Sekine | H01L 24/85 |
| 9,461,012 B2 | 10/2016 | Higgens, III et al. | |
| 9,508,702 B2 * | 11/2016 | Reber | H01L 24/81 |
| 9,780,069 B2 * | 10/2017 | Haga | B23K 20/005 |
| 9,793,236 B2 * | 10/2017 | Sekine | H01L 24/78 |
| 2006/0006505 A1 * | 1/2006 | Chiang | H01L 21/4825 257/666 |
| 2006/0012024 A1 * | 1/2006 | Lin | H01L 21/4853 257/692 |
| 2007/0015353 A1 * | 1/2007 | Craig | H01L 24/48 438/617 |
| 2010/0102444 A1 * | 4/2010 | Khor | H01L 24/48 257/737 |
| 2012/0032354 A1 * | 2/2012 | Pham | B23K 20/007 257/784 |
| 2014/0061821 A1 * | 3/2014 | Kawano | H01L 23/49548 257/401 |
| 2016/0035652 A1 * | 2/2016 | Yano | H01L 23/49513 257/676 |
| 2017/0179065 A1 * | 6/2017 | Koo | H01L 24/48 |
| 2019/0181072 A1 * | 6/2019 | Shojaie | H01L 25/0657 |

* cited by examiner

WIRE BONDING TECHNIQUE FOR INTEGRATED CIRCUIT BOARD CONNECTIONS

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to wire bonds for connecting integrated circuits to computer circuit boards. In particular, the invention relates to producing a wire connection having improved pull-test characteristics over conventional techniques. Approximately ninety percent of all semiconductor packages are manufactured using conventional wire bonding techniques.

Conventional wire bonding techniques, e.g., thermosonic ball bonding, employ a capillary dispenser to release a conductive wire, typically gold (Au). Ultrapure gold, although extremely resistant to corrosion, is relatively soft and fragile. Hence, trace amounts of impurities such as 3 ppm to 10 ppm of beryllium (Be), 0.1 ppm to 100 ppm of copper (Cu), 1 ppm to 5 ppm of iron (Fe), and/or 3 ppm to 10 ppm of silver (Ag) are added to create interstitial defects within the molecular structure of the gold wire to improve overall ductility and toughness.

The process generally begins with the creation of a free air ball (FAB) extended beneath the capillary dispenser by using an electronic flame off (EFO) system to melt a small portion of the wire. The surface tension of the molten metal forms a spherical shape (or ball) as the metal cools and solidifies. The bonding surface is heated using a specially designed temperature-controlled wire bonding fixture. Upon creation of the FAB, a first bond can be formed by depositing gold from the capillary dispenser onto a die pad on an integrated circuit (IC) chip die, while employing sufficient ultrasonic power (in watts, typically 0.5 W to 2.0 W), ultrasonic frequency (typically 50 kHz to 75 kHz), temperature (typically 100° C. to 200° C.), machine-over-travel (typically 0.001 inch to 0.005 inch), and duration (in milliseconds, e.g., 50 ms to 150 ms) to cause the plastic deformation of the wire and intermetallic connection of the wire to the bonding surface. This ensures electrical and mechanical contacts between the two metal surfaces without solder.

The capillary dispenser is then raised and repositioned over the second bond site on the circuit board pad, which creates a precisely shaped wire connection called a wire spool. The second loop is then created by depositing the gold onto the circuit board pad via the capillary dispenser, while employing conditions of force, temperature and duration to induce plastic deformation of the wire and intermetallic connection of the wire to the bonding surface. This ensures electrical and mechanical contacts between the two metal surfaces.

SUMMARY

Conventional wire bonding techniques yield disadvantages addressed by various exemplary embodiments of the present invention. In particular, exemplary embodiments provide a method for connecting a chip die to a circuit board with a capillary dispenser to deposit gold. The method includes forming a first bond by depositing gold from the dispenser to a board pad on the circuit board; forming a second bond by depositing the gold from the dispenser to a die pad on the chip die; extruding a filament of the gold by the dispenser in a normal direction from the second bond; rotating the filament laterally away from the first bond along a first radius; and extruding the filament while rotating the filament towards the first bond along a second radius larger than the first radius; and forming a third bond by depositing the gold on the first bond to form a third bond.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
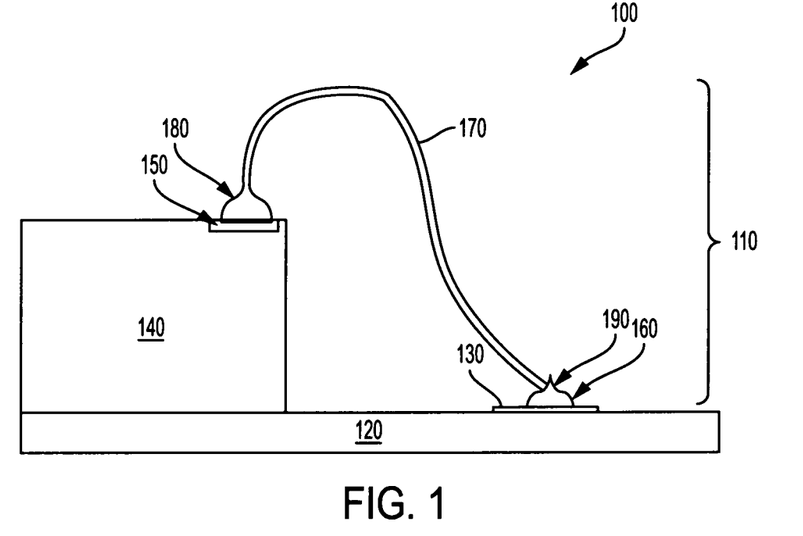
FIG. 1 is an elevation view of an exemplary wire bond.

FIG. 1 shows an elevation view 100 of an exemplary wire bond configuration 110 between a circuit board 120 at a board pad 130 and a chip die 140 at a die pad 150. The wire bond 110 includes an A bond 160 on the board pad 130. A loop of gold wire 170 connects a B bond 180 on the die pad 150 to a C bond 190 atop the A bond 160. The views shown are representative and not to scale.

Exemplary method embodiments provide a wire bonding technique for producing an electrical connection via a gold wire 170 between a circuit board 120 and a chip die 140 that has improved tensile and shear strength against disconnecting breakage over conventional techniques. The exemplary techniques include creation of a free air ball (FAB) of gold (or alternate conductive metal) extended beneath a capillary dispenser using an electric flame off (EFO) design to melt a small portion of the wire. The surface tension of the molten gold yields a spherical shape (ball) as that metal cools and solidifies.

Upon creating the FAB, the first bond can be formed by depositing gold from the capillary dispenser onto the board pad 130 under conditions to enable plastic deformation of the wire 170 and its intermetallic connection to the bonding surface of the board pad 130. This ensures electrical and mechanical contact between the metal board and die pads 130 and 150. The process includes extruding a filament of gold by the capillary dispenser in a normal direction from the second bond on the die pad 150, rotating the filament laterally away from the first bond along a first radius, extruding the filament further while rotating that filament towards the first bond along a second radius larger than the first radius to produce the loop, and forming a third bond by depositing the gold again on the first bond on the board pad 130. These conditions involve applied force, wire temperature and deposit time to induce plastic deformation of the wire 170 and its intermediate connection to the bonding surfaces.

Figure 2:
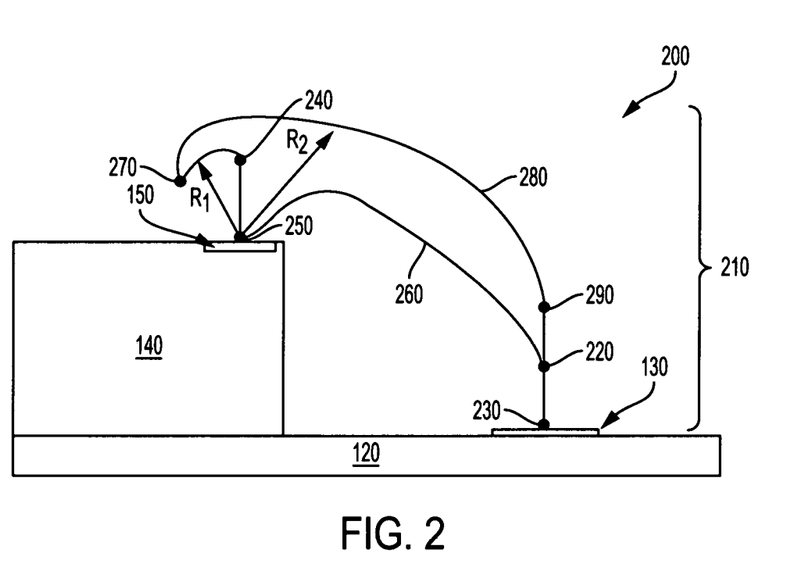
FIG. 2 is an elevation view of a capillary path steps.

FIG. 2 shows an elevation view 200 of a capillary trajectory path along a series of several schematic steps 210. The first step at position 220 initiates above the board pad 130 before descending to the second step at position 230 that touches the board pad 130 and then returning to position 220 at the third step. The fourth step initiates at position 240 above the die pad 150 before descending to the fifth step at position 250 that touches the die pad 150 and then returning to position 240 at the sixth step. The path 260 approximates the travel between positions 220 and 250 from the third to fifth steps. The seventh step rotates (along an axis normal to the plane of view 200) along radius $R_1$ to position 270 before rotating along radius $R_2$ along path 280 to the ninth step at position 290.

Figure 3:
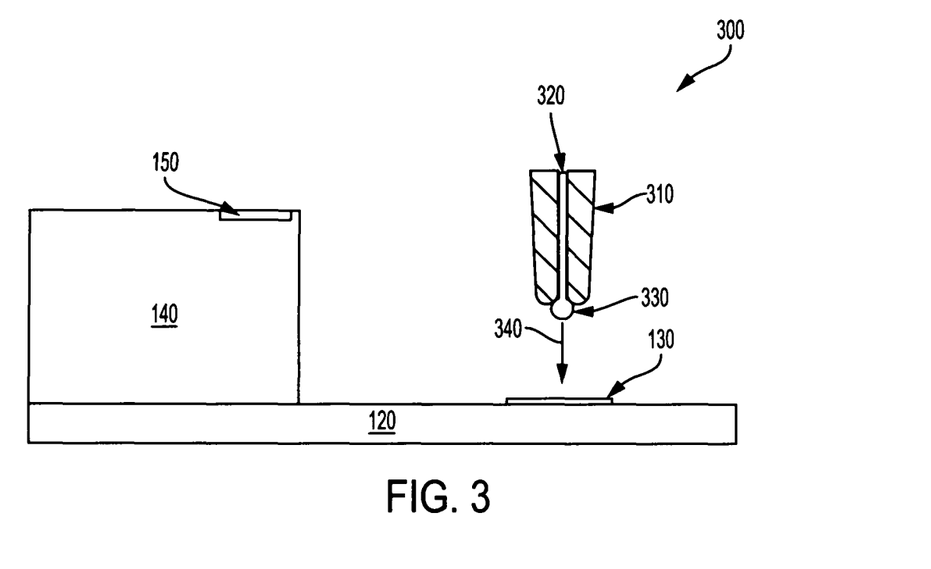
FIG. 3 is an elevation view of the first step in the path.
Figure 4:
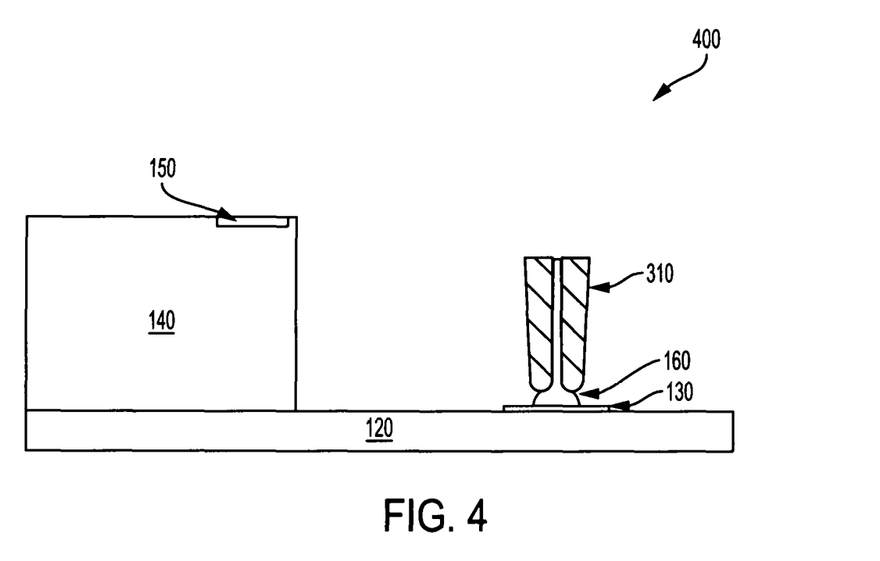
FIG. 4 is an elevation view of the second step in the path.

FIG. 3 shows an elevation view 300 of a capillary wire bond dispenser 310 containing molten gold 320 at the first step. The dispenser 310 releases the gold at its tip as a free air ball (FAB) 330. In the first step at position 220, the dispenser 310 descends along path 340 towards the board pad 130 to produce the A bond 160. FIG. 4 shows an elevation view 400 of the dispenser 310 at the second step. The gold 320 is drawn as wire 170 under pressure from the dispenser tip at position 230 and deposits on the board pad 130 to form the A bond 160.

Figure 5:
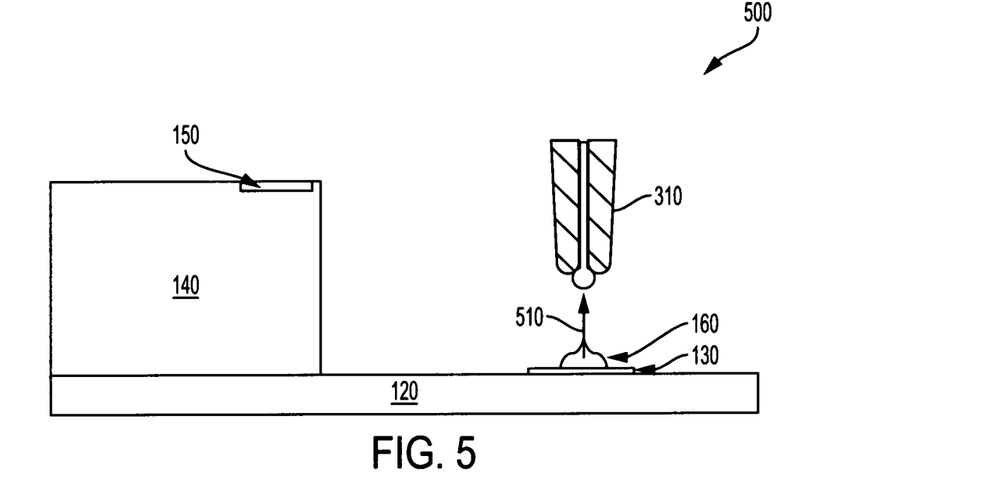
FIG. 5 is an elevation view of the third step in the path.
Figure 6:
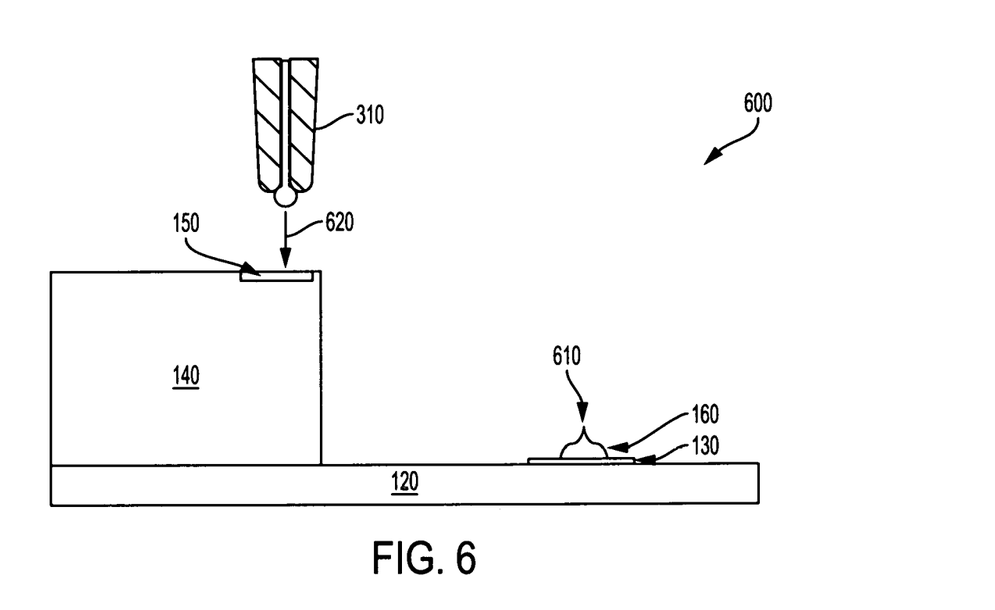
FIG. 6 is an elevation view of the fourth step in the path.

FIG. 5 shows an elevation view 500 of the dispenser 310 at the third step. Upon sufficient release of gold 320 to form the A bond 160, capillary flow discontinues, whereupon the dispenser 310 rises and returns to position 220 with an FAB 330 forming at the tip. FIG. 6 shows an elevation view 600 of the dispenser 310 at the fourth step having translated to position 240 above the die pad 150. The tip 610 of the A bond 160 denotes the location for the subsequent C bond 190. From the fourth step, the dispenser 310 descends along path 620 towards the die pad 150.

Figure 7:
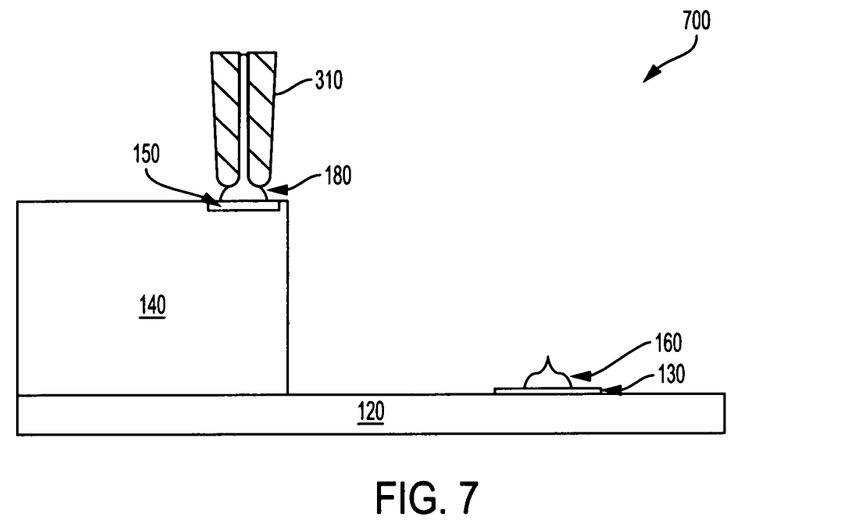
FIG. 7 is an elevation view of the fifth step in the path.
Figure 8:
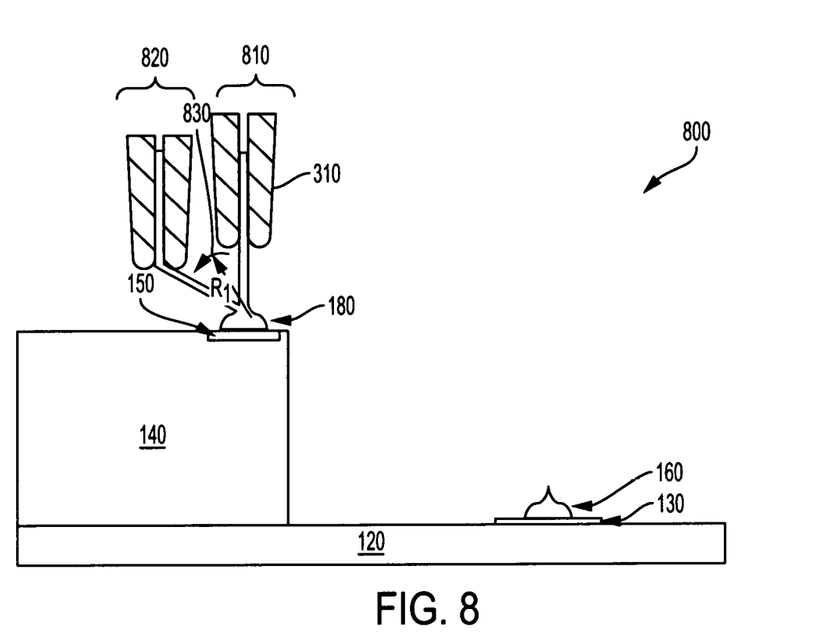
FIG. 8 is an elevation view of the sixth and seventh steps in the path.

FIG. 7 shows an elevation view 700 of the dispenser 310 at the fifth step. The gold 320 is drawn as wire 170 under pressure from the dispenser tip at position 250 and deposits on the die pad 150 to form the B bond 180. FIG. 8 shows an elevation view 800 of the dispenser 310 at the sixth and seventh steps. After sufficient release of gold 320 to form the B bond 180, capillary flow continues to form an extending filament, whereupon the dispenser 310 rises in dispensing location 810 and returns the tip to position 240 at the sixth step. Then the dispenser 310 rotates along radius $R_1$ in a lateral direction to dispensing location 820 opposite to the A bond 160 along a curved path 830.

Figure 9:
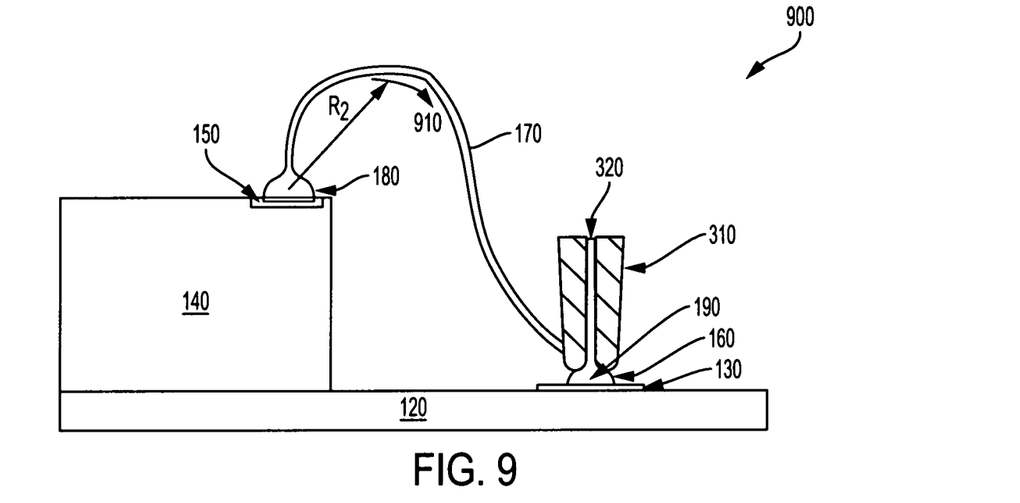
FIG. 9 is an elevation view of the eighth step in the path.

FIG. 9 shows an elevation view 900 of the dispenser 310 at the eighth step. While the capillary flow of gold 320 continues, the dispenser 310 rotates along radius $R_2$ in a lateral direction towards the A bond 160 along a curved path 910. With the tip at position 230, the dispenser 310 deposits gold 320 atop the A bond 160 to form the C bond 190.

Figure 10:
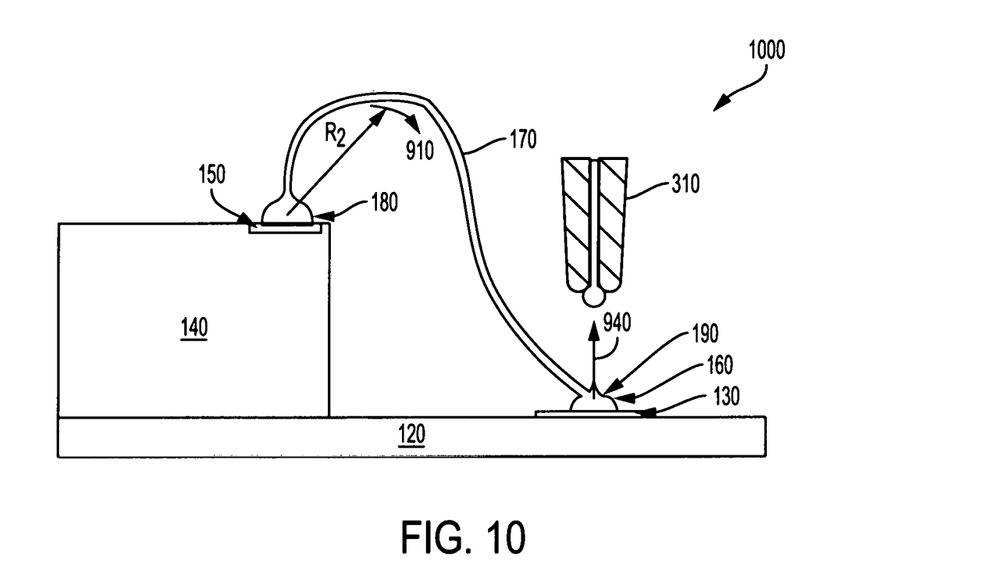
FIG. 10 is an elevation view of the ninth step in the path.

FIG. 10 shows an elevation view 1000 of the dispenser 310 at the ninth step. Upon sufficient release of gold 320 to form the C bond 190, capillary flow from the dispenser 310 discontinues, whereupon the dispenser 310 rises and returns to position 220 with an FAB 330 again forming at the tip. The wire bond forming process is thus completed to produce the wire 170 between the board and die pads 130 and 150.

The wire diameter for the loop of gold wire 170 typically used in this process is comparatively small, typically between 0.2 μm to 30 μm depending on the application; and generally the wire diameter should not exceed one-quarter of the pad size in the given application. The wire spool is approximately 350 feet in length. The size of the free air ball (FAB) 330 is approximately two to three times the wire diameter, although it can be as small as 1.5 times for small ball wire bonding applications with fine pitches, and up to three-to-four times for large bond pad bonding applications. The size of the bond should not exceed three-quarters of the pad size or about 2.5 to five times the wire diameter, depending on the bond geometry and tool path of the capillary during bonding operations. A speed of ten complete wire bond connections per second is typically achieved with fully automated wire bonding equipment.

This technique was qualified using six-sigma process improvement methods that include the define-measure-analyze-improve-control (DMAIC) paradigm and validated against standardized test method MIL-STD-883J, Method 2011.9 Bond Strength (Destructive Bond Pull Test). Qualification techniques such as the design of experiment (DoE) and statistical process control (SPC) have been employed. DoEs were used to identify factors (wire bonding input conditions, such as force, temperature, pressure) and at which levels (machine settings) would be required to achieve producing a reliable and repeatable wire bond by a particular technique. Before-and-after capability analysis, the implementation of DoE techniques has been demonstrated to significantly improve the mechanical pull test result of wire bonds.

Experimentation was performed on bare integrated circuit (IC) die ranging in area (square-inches) from 0.060 $in^2$ to 0.150 $in^2$. These exemplary techniques are assumed to be suitable for wire bonding any IC die ranging in size from 0.020 $in^2$ to 0.500 $in^2$ (if not larger) depending on the desired application and equipment utilized. Wire bonding using the exemplary techniques may be accomplished in a controlled environment at standard atmosphere (sea level pressure at 20° C. and ambient temperature) with no special chemicals other than those found in air. The humidity and particulate density in the wire bonding environment are typically controlled using typical filtration equipment.

The capillary dispenser 310 used for this exemplary process can be made from ceramic, tungsten, ruby or similar materials. The most common material is a high density fine grain alumina ($Al_2O_3$) ceramic because of its high wear and oxidation resistance. The surface finish on the capillary can be polished or matte. A polished surface capillary is used when in the presence of a clean bonding surface and good (i.e., functional) ability to form mechanical and electrical bonds. A matte finish is used when the surface shows less than ideal qualities.

The capillary dispenser 310 is typically 1.5 mm in diameter and approximately 10 mm in length. There is a large entry hole at the top of the capillary dispenser 310 that tapers to a small inside diameter (typically between 30 μm and 55 μm) where the gold wire 170 exits via gravity feed from the tip at the bottom. The inside diameter of the capillary tip depends on the wire diameter incorporated, as well as the intended application.

At the tip of the capillary dispenser 310 there is typically an inside chamfer, which is designed to seat the FAB 330 in the tool and provide sufficient downward force. The degree of chamfer varies depending on the application, and a few examples are further discussed. A 120° chamfer is designed for operation on less-than-ideal bonding surfaces by providing more downward force, but has the disadvantage of placing more drag on the bonding wire 170 while exiting the capillary dispenser 310. A 90° chamfer is designed for use on ideal bonding surfaces providing downward force and relatively little drag on the bonding wire 170. There is also a double inside chamfer capillary which is designed to combine the qualities of both the 120° and 90° capillaries.

Figure 11:
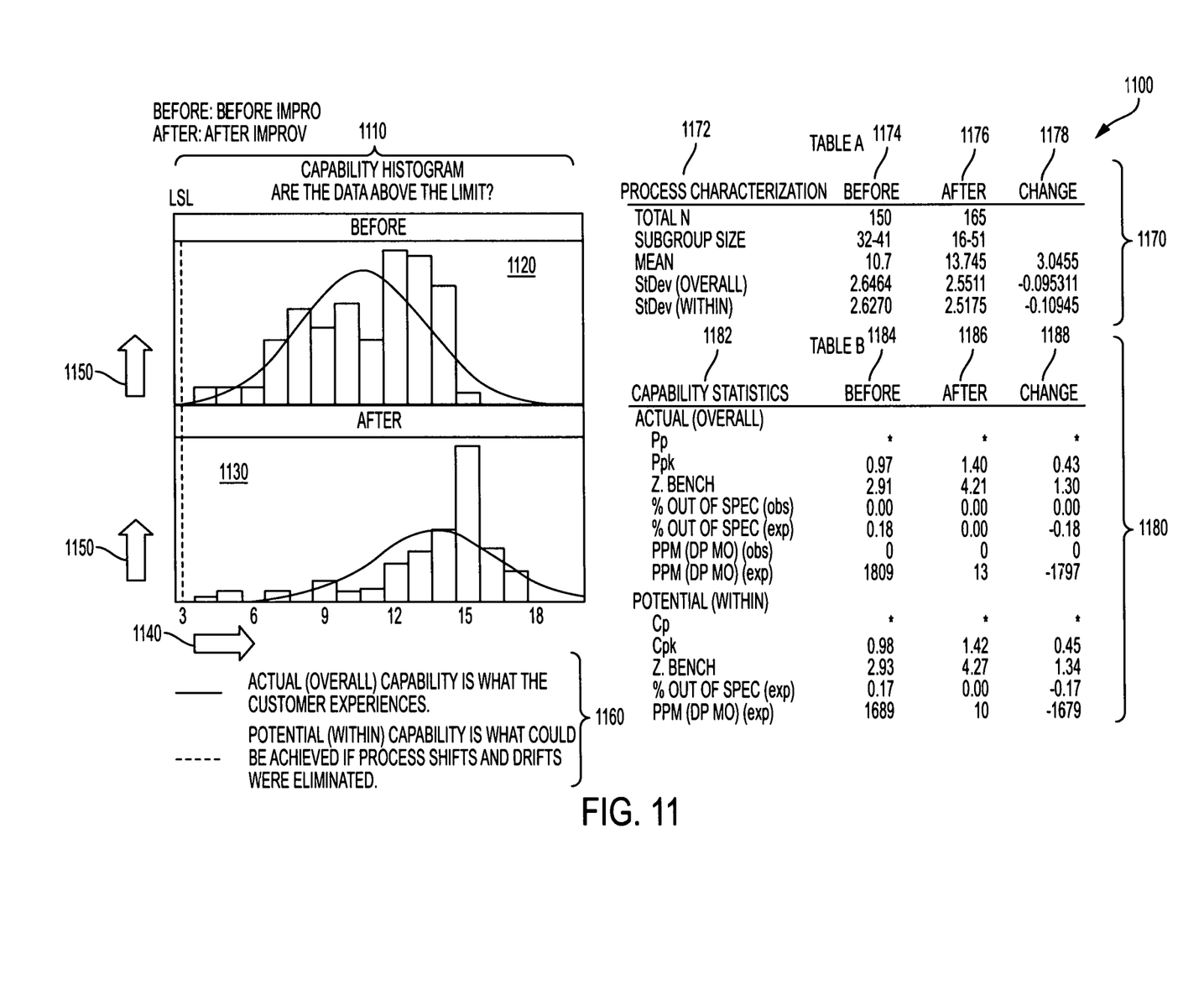
FIG. 11 is a diagram view of manufacturing process capability comparison between conventional and exemplary bonding techniques.

FIG. 11 shows tabular and graphical views 1100 of manufacturing process capability comparisons between conventional and exemplary bonding techniques to demonstrate improvement in wire bond pull test results. A set of capability histograms 1110 shows a conventional before plot 1120 and an exemplary after plot 1130, both with pull test value (in grams) 1140 as the abscissa and frequency 1150 (i.e., the number of events the pull test value was achieved) as the ordinate. A legend 1160 distinguishes between the solid line for actual overall capability from physically obtained examples and the dash line for ideal without process shifts and drifts. The histograms 1110 show an increase in peak from 10.7 to 13.7 and a general trend towards tightening of the groupings.

Table A 1170 lists process characterizations 1172 compared by before 1174, after 1176 and change difference 1178. Table B 1180 shows capability statistics 1182 for before 1184, after 1186 and change difference 1188. These show part-to-part variation, both between and within components using exemplary wire bonding techniques, evaluated to determine the presence of any statistically significant changes in the process mean and standard deviations. The differences 1178 and 1188 clearly demonstrate the mean increases by about thirty percent and the standard deviations (overall and within) decrease by about four percent, as well as over forty percent increase in Z-bench.

Figure 12:
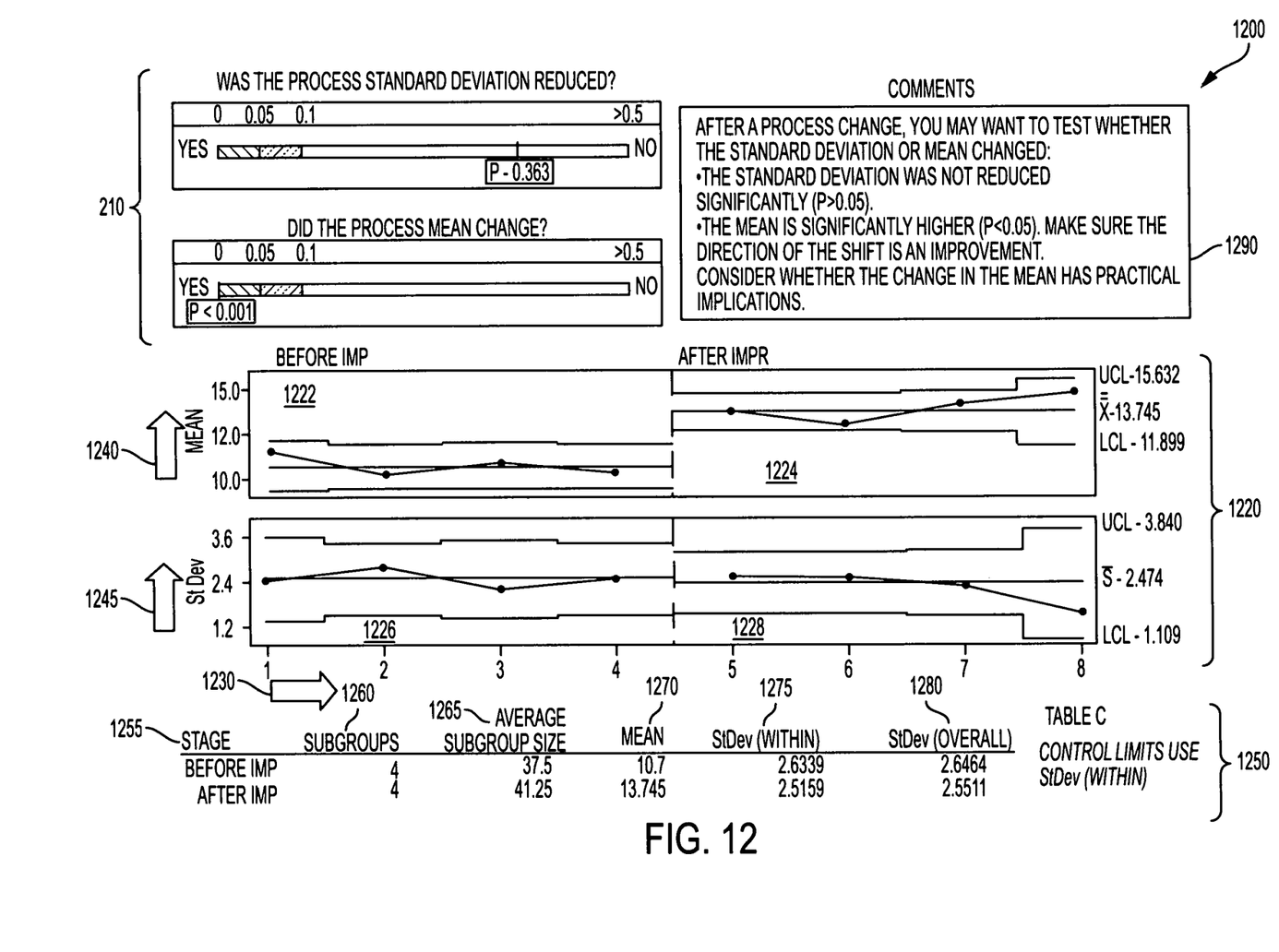
FIG. 12 is a diagram view of X-bar S charts.

FIG. 12 shows tabular and graphical views 1200 for the X-bar (mean) and S (standard deviation) chart plots and evaluates the mean pull test result of each test rig and the standard deviation of each test rig. Compliance graphs 1210 show success results for the process indicating confidence that the improved process altered the mean and but did not significantly reduce the standard deviation. Between-part variation in relation to the exemplary improvement is shown in graphs 1220 as mean before 1222, mean after 1224, standard deviation before 1226 and standard deviation after 1228. Test numbers 1230 denote the abscissa while mean pull value 1240 and standard deviation 1245 denote the ordinates for the graphs 1220.

Table C 1250 lists these before-and-after comparisons by stage 1255, subgroups 1260, average subgroup 1265, mean 1270 and standard deviation 1280. These values show the mean 1270 increases by about thirty percent and standard deviation 1280 decreases slightly. Comments 1290 are provided in the upper right. As can be observed, level for the average line between points in graphs 1222 and 1224 corresponds to the value in mean column 1270. These views 1200 establish the "between-part" variability for a handful of samples. The analyses conclude that the process mean for between-part process control has increased by a statistically significant amount when analyzed between subgroup. The increase in the mean pull test produces an improvement based on test results with conventional wire bonding techniques.

Figure 13:
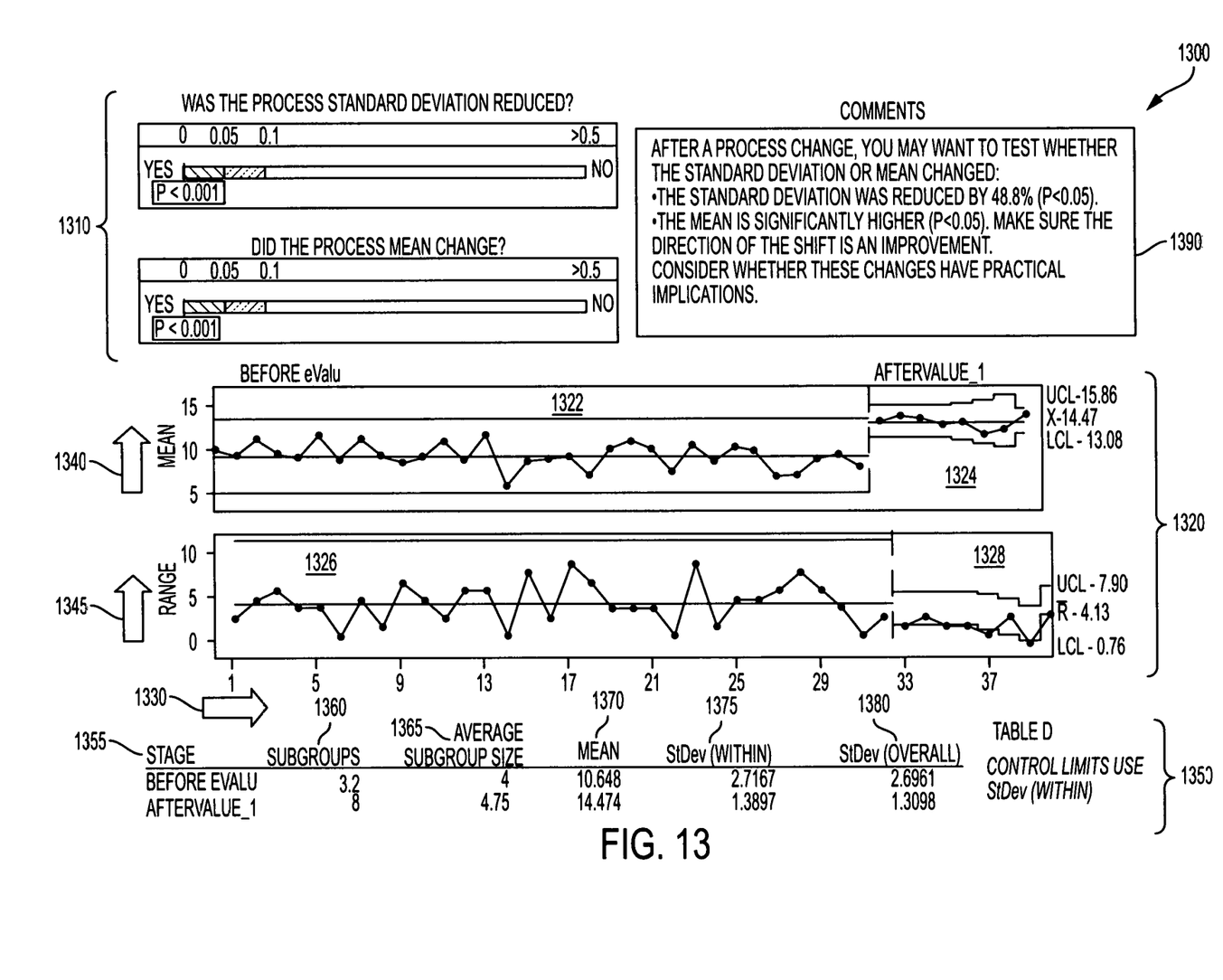
FIG. 13 is a diagram view of X-bar R charts.

FIG. 13 shows tabular and graphical views 1300 for the X-bar (mean) and R (range) plots evaluate the mean pull test result and the range as a function of each bond location on a given test rig. Compliance graphs 1310 show success results for the process indicating confidence that the improved process altered the mean and also significantly reduced the standard deviation (by almost 49 percent). Within-part variation in relation to the exemplary improvement is shown in graphs 1320 as mean before 1322, mean after 1324, range before 1326 and range after 1328. Test numbers 1330 denote the abscissa while mean pull value 1340 and ranges 1345 denote the ordinates for the graphs 1320.

Table D 1350 lists these comparisons by stage 1355, subgroups 1360, average subgroup 1365, mean 1370 and standard deviation 1380. These values show the mean 1370 increases by about thirty-five percent and standard deviation 1380 reduces by half. Comments 1390 are provided in the upper right. These views 1300 assess the "within-part" variation. As can be observed, the levels for the average line between points in graphs 1322 and 1324 correspond to the value in mean column 1370. The analyses conclude that both the process mean and range for within part process have both increased by a statistically significant amount based on board location. These increases represent a dramatic improvement from previous results using conventional wire bonding techniques.

The 1210 and 1310 graphs respectively represent the results of hypothesis testing and a p-value less than 0.05 indicates a rejection of the null hypothesis $H_0$. In this case, the null hypotheses are: the means, standard deviations, ranges, etc. of the before and after subgroups do not differ (i.e., they are the same). A rejection of the null hypothesis is an acceptance of the alternate hypothesis $H_a$. For these circumstances, the alternate hypotheses are: the means, standard deviations, ranges, etc. of the before and after subgroups differ from each other. A p-value of less than 0.05 indicates that with greater than 95-percent confidence the conclusion that these parameters are statistically distinct.

The confidence can be likened to the reciprocal of the p-value because they employ the same principles of probabilistic calculation. This difference is stated as "statistically significant" because the conclusion uses a confidence level. These are just a few of the statistical tools that can be employed in six-sigma process improvement settings.

These tools are not intended to be a substitute for human data analysis, but instead complement or reinforce the conclusions available through data analysis. These analysis tools are not intended to be used separately, such as basing a decision solely on a given p-value without collection and analysis of other data. Through data analysis, consistency has been demonstrated by visual shifts in the X-bar/S or X-bar/R charts, in conjunction with statistically significant p-values. Otherwise, further review would be initiated of changes actually causing differences in outcome and warrant further testing and investigation.

In the plots 1220 and 1320 presented, there are vertical shifts in the respective X-bar/S and X-bar/R charts. The process mean changed in both the between and within part sampling, but not the standard deviation. The lack of reduction in standard deviation in plot 1220 can be attributed to unequal sample size. For example, the eighth point on the after chart 1228 clearly shows that the upper and lower control limits are extremely wide when compared to all other samples. This is due to a smaller sample size in subgroup-8, so statistically, the control limits must be wider due to the smaller sample size. When performing the hypothesis test to account for unequal sample sizes, the result states that statistically, the evidence is insufficient to conclude with 95-percent confidence that the standard deviation actually reduced, but limits in sample availability for destructive testing precludes acquisition of further test data.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A method for connecting a chip die to a circuit board with a capillary dispenser to deposit gold, said dispenser forming a free air ball (FAB) at a depositing tip, said method comprising:
   forming a first bond by depositing the gold at the FAB from the tip to a board pad on the circuit board;
   forming a second bond by depositing the gold at the FAB from the tip to a die pad on the chip die;
   extruding a filament of the gold by the tip in a normal direction from said second bond;
   rotating said filament laterally away from said first bond along a first radius;
   extruding said filament while rotating said filament towards said first bond along a second radius; and
   forming a third bond by depositing the gold at the FAB by the tip on said first bond to form said third bond.

2. The method according to claim 1, wherein said second radius is larger than said first radius.

3. The method according to claim 1, wherein said filament has diameter between 0.2 µm to 30 µm.

* * * * *